US012757339B2

(12) United States Patent
Hou et al.

(10) Patent No.: US 12,757,339 B2
(45) Date of Patent: Oct. 6, 2026

(54) FLEXIBLE DISPLAY DEVICE

(71) Applicant: KUNSHAN GO-VISIONOX OPTO-ELECTRONICS CO., LTD., Kunshan (CN)

(72) Inventors: Hongqi Hou, Kunshan (CN); Fu Liao, Kunshan (CN); Zhaoji Zhu, Kunshan (CN); Shishui Yu, Kunshan (CN); Yuhua Wu, Kunshan (CN); Desong Yan, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 92 days.

(21) Appl. No.: 19/053,792

(22) Filed: Feb. 14, 2025

(65) Prior Publication Data

US 2025/0194026 A1 Jun. 12, 2025

Related U.S. Application Data

(63) Continuation of application No. PCT/CN2022/127847, filed on Oct. 27, 2022.

(30) Foreign Application Priority Data

Aug. 31, 2022 (CN) ........................ 202211052319.X

(51) Int. Cl.
*H05K 5/02* (2006.01)

(52) U.S. Cl.
CPC .................................. *H05K 5/0217* (2013.01)

(58) Field of Classification Search
CPC ........................................................ H05K 5/00
See application file for complete search history.

(56) References Cited

U.S. PATENT DOCUMENTS

2013/0058063 A1 3/2013 O'Brien
2020/0315036 A1* 10/2020 Ahn ...................... G06F 1/1624
(Continued)

FOREIGN PATENT DOCUMENTS

CN 107424518 A 12/2017
CN 108399861 A 8/2018
(Continued)

OTHER PUBLICATIONS

International Search Report issued on Feb. 22, 2023, in corresponding International Application No. PCT/CN2022/127847, 7 pages.
(Continued)

*Primary Examiner* — Jerry Wu
(74) *Attorney, Agent, or Firm* — Maier & Maier, PLLC

(57) ABSTRACT

A flexible display device includes a fixed portion, a shaft, a first screen end fixing member, a second screen end fixing member, a flexible display screen, a first elastic member and a second elastic member. The shaft is arranged on the fixed portion; the first screen end fixing member is slidably mounted on the fixed portion, and a sliding direction is perpendicular to an axial direction of the shaft; the second screen end fixing member is slidably mounted on the fixed portion, and a sliding direction is perpendicular to the axial direction of the shaft. The flexible display screen is wound on the shaft, one end of the flexible display screen is fixed to the first screen end fixing member, and the other end is fixed to the second screen end fixing member.

19 Claims, 11 Drawing Sheets

(56) References Cited

U.S. PATENT DOCUMENTS

| | | | | |
|---|---|---|---|---|
| 2022/0053653 | A1 | 2/2022 | Jung et al. | |
| 2022/0117100 | A1 | 4/2022 | Yoon et al. | |
| 2022/0130287 | A1 | 4/2022 | Feng | |
| 2022/0148476 | A1 | 5/2022 | Min et al. | |
| 2022/0155824 | A1 | 5/2022 | Kang et al. | |
| 2022/0236767 | A1* | 7/2022 | Zhang | G06F 1/1681 |

FOREIGN PATENT DOCUMENTS

| | | | |
|---|---|---|---|
| CN | 110572497 | A | 12/2019 |
| CN | 111587016 | A | 8/2020 |
| CN | 111613144 | A | 9/2020 |
| CN | 212229972 | U | 12/2020 |
| CN | 112466217 | A | 3/2021 |
| CN | 113067915 | A | 7/2021 |
| CN | 113129758 | A | 7/2021 |
| CN | 113163039 | A | 7/2021 |
| CN | 113345330 | A | 9/2021 |
| CN | 113506516 | A | 10/2021 |
| CN | 113516920 | A | 10/2021 |
| CN | 113852702 | A | 12/2021 |
| CN | 113890919 | A | 1/2022 |
| CN | 215679899 | U | 1/2022 |
| CN | 114495700 | A | 5/2022 |
| CN | 114501915 | A | 5/2022 |
| CN | 114585178 | A | 6/2022 |
| CN | 114598759 | A | 6/2022 |
| CN | 113436536 | B | 8/2022 |
| CN | 115206195 | A | 10/2022 |
| EP | 4009134 | A1 | 6/2022 |
| JP | 2012134971 | A | 7/2012 |
| KR | 20200037693 | A | 4/2020 |

OTHER PUBLICATIONS

Office Action issued on May 10, 2023, in corresponding Chinese Application No. 202211052319.X, 8 pages.
Notice of Allowance issued on Feb. 24, 2026, in corresponding Japanese Application No. 2025-511673, 5 pages.
Extended Search Report issued on Nov. 26, 2025, in corresponding European Application No. 22957119.5, 12 pages.

* cited by examiner

FLEXIBLE DISPLAY DEVICE

CROSS REFERENCE TO RELATED APPLICATION

The present application is a continuation of International Application No. PCT/CN2022/127847, filed on Oct. 27, 2022, which claims priority to Chinese Patent Application No. 202211052319.X, filed on Aug. 31, 2022, titled with "FLEXIBLE DISPLAY DEVICE", both of which are hereby incorporated by reference in their entireties.

TECHNICAL FIELD

The present application relates to the technical field of display, and in particular to a flexible display device.

BACKGROUND

With the development of display device technology, display devices have developed a variety of usage forms. As a new display product, a flexible rollable display device and a flexible slidable stretching display device are in line with the trend of the future development. The rollable performance has a high requirement for the flexible screen and terminal structure, and it is still difficult to achieve mass production at present. However, the display device with a slidable stretching form meets the current development needs of mobile terminals, which can achieve the unfolding and folding of a screen.

SUMMARY

The present application provides a flexible display device, which can reduce the risk of a display abnormality.

Embodiments in the present application provide a flexible display device including a fixed portion, a shaft, a first screen end fixing member, a second screen end fixing member, a flexible display screen, a first elastic member and a second elastic member.

The shaft is arranged on the fixed portion; the first screen end fixing member is slidably mounted on the fixed portion, and a sliding direction is perpendicular to an axial direction of the shaft; the second screen end fixing member is slidably mounted on the fixed portion, and a sliding direction is perpendicular to the axial direction of the shaft. The flexible display screen is wound on the shaft, one end of the flexible display screen is fixed to the first screen end fixing member, and the other end of the flexible display screen is fixed to the second screen end fixing member.

The first elastic member is mounted between the fixed portion and the first screen end fixing member, and provides a first elastic force to the first screen end fixing member; the second elastic member is mounted between the fixed portion and the second screen end fixing member, and provides a second elastic force to the second screen end fixing member.

The first elastic force at least partially maintains equilibrium with the second elastic force.

The embodiments of the present application provide the flexible display device. The first elastic force and the second elastic force, as stretching forces, are exerted to two ends of the flexible display screen, respectively. The first elastic force can maintain equilibrium with a friction force generated between a side of the fixed portion facing the first screen end fixing member and the flexible display screen, and the second elastic force can maintain equilibrium with a friction force generated between the fixed portion facing the second screen end fixing member and the flexible display screen. The first elastic force and the second elastic forces can reduce the friction impact of two sides of the fixed portion on the flexible display screen, thereby reducing the risk of the excessive force difference between two ends of the flexible display screen caused by the friction force, and improving the reliability of the flexible display device.

BRIEF DESCRIPTION OF THE DRAWINGS

In order to more clearly illustrate the technical solution of the embodiments of the present application, the drawings required to be used in the embodiments of the present application will be briefly introduced below. Obviously, the drawings described below only show some embodiments of the present application. For those skilled in the art, other drawings can also be obtained according to these drawings without the inventive labor.

DETAILED DESCRIPTION

Figure 1:
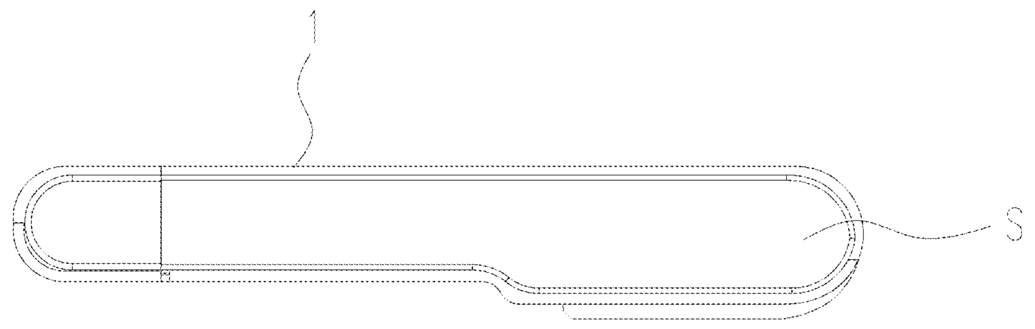
FIG. 1 shows a structural schematic view of a flexible display device in a folded state according to some embodiments of the present application.
Figure 2:
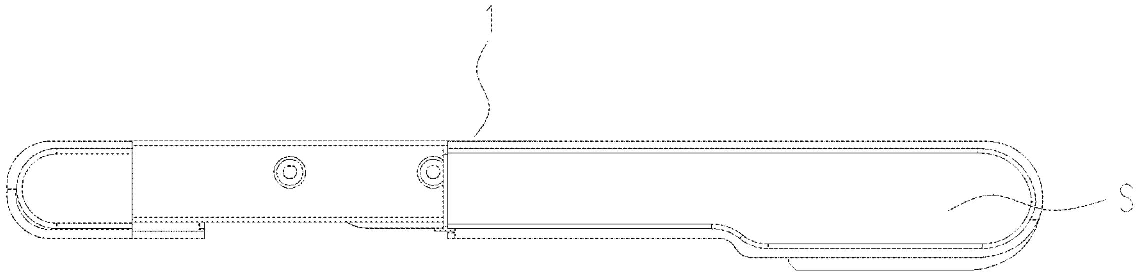
FIG. 2 shows a structural schematic view of a flexible display device in a unfolded state according to some embodiments of the present application.
Figure 3:
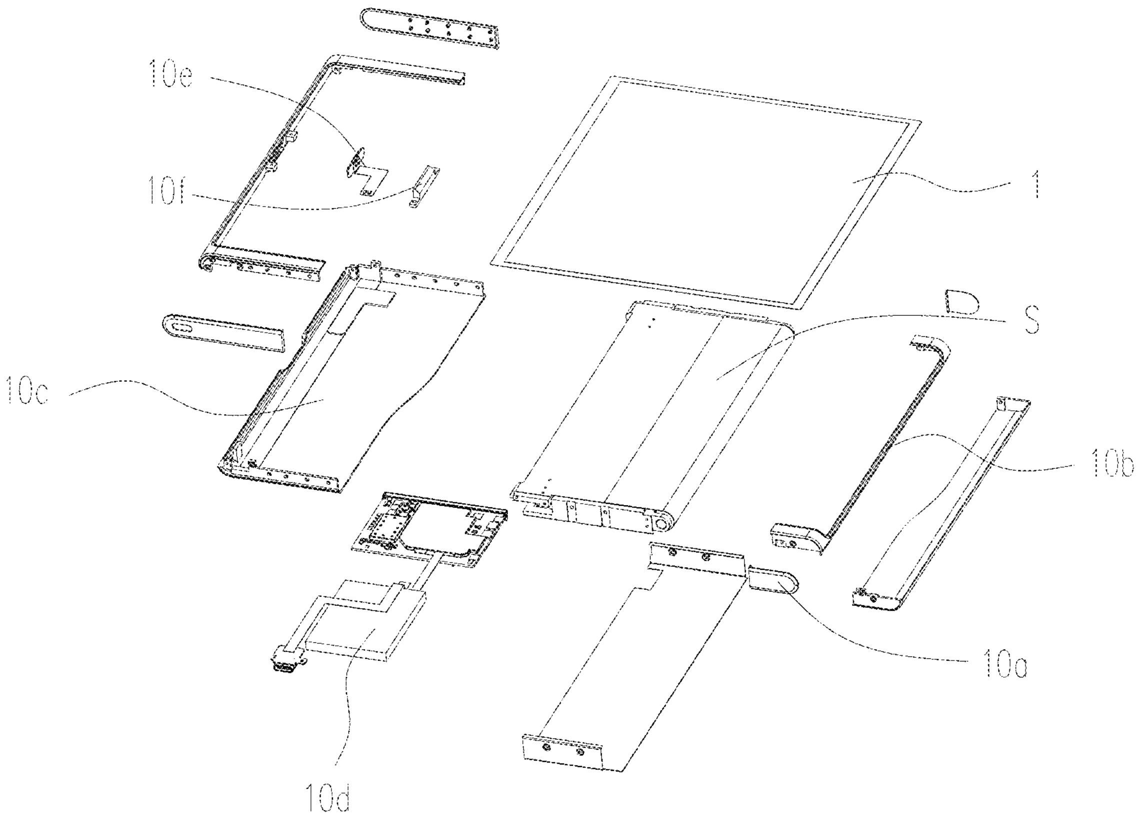
FIG. 3 shows an exploded structural schematic view of a flexible display device according to some embodiments of the present application.

Embodiments of the present application will be further described in detail according to the drawings and examples below. The detailed description and drawings of the following embodiments are used to exemplarily illustrate the principles of the present application, but cannot be used to limit the scope of the present application, that is, the present application is not limited to the described embodiments.

According to the research, the applicant has found that during a sliding process of a flexible display device that can achieve the sliding stretch, a flexible display screen needs to synchronously stretch and retract with a sliding end, while the flexible display screen can move relative to a shaft. During this process, an end of the flexible display screen hidden inside the flexible display device is constantly subjected to a stretching force. However, due to factors such as a friction force between the flexible display screen and the shaft, a portion of the stretching force will be balanced at a middle position of the flexible display screen, resulting in a force on an end located on a light-emitting face of the flexible display screen being less than the stretching force on the other end. In this case, in order to ensure that the end located on the light-emitting face of the flexible display screen can receive a sufficient external force to unfold the flexible display device, it is necessary to provide a large stretching force, and the stretching force will increase with the increase of a sliding distance, which is prone to the display abnormality.

In order to solve the problem, referring to FIG. 1 to FIG. 6, the embodiments of the present application provide a flexible display device, including a fixed portion 2, a shaft 21, a first screen end fixing member 3, a second screen end fixing member 4, a flexible display screen 1, at least one first elastic member 22 and at least one second elastic member 23.

The shaft 21 is arranged on the fixed portion 2; the first screen end fixing member 3 is slidably mounted on the fixed portion 2, and a sliding direction is perpendicular to an axial direction of the shaft 21; the second screen end fixing member 4 is slidably mounted on the fixed portion 2, and a sliding direction is perpendicular to the axial direction of the shaft 21. The flexible display screen 1 is wound on the shaft 21, one end of the flexible display screen 1 is fixed to the first screen end fixing member 3, and the other end of the flexible display screen 1 is fixed to the second screen end fixing member 4.

The first elastic member 22 is mounted between the fixed portion 2 and the first screen end fixing member 3, and provides a first elastic force F1 to the first screen end fixing member 3; the second elastic member 23 is mounted between the fixed portion 2 and the second screen end fixing member 4, and provides a second elastic force F2 to the second screen end fixing member 4. The first elastic force F1 at least partially maintains equilibrium with the second elastic force F2.

The flexible display device provided by the embodiments of the present application includes at least two states: a folded state and an unfolded state. Compared to the folded state, the flexible display device has a larger displayable screen size in the unfolded state, thereby improving the user experience.

The flexible display screen 1 is a main part in the flexible display device which is used to achieve the display function. When the flexible display device is used, corresponding image informations need to be transmitted to the flexible display screen 1 and the display is achieved through the flexible display screen 1.

The flexible display device includes a stretching-and-retracting structure S. All of the fixed portion 2, the shaft 21, the first screen end fixing member 3, the second screen end fixing member 4, the first elastic member 22 and the second elastic member 23 are included in the stretching-and-retracting structure S. The stretching-and-retracting structure S itself can be deformed, and the stretching-and-retracting structure S is the main part in the flexible display device which is used to achieve the stretching-and-retracting effect.

The fixed portion 2 is used to mount the shaft 21, which is rotationally connected to the fixed portion 2. In the folded state, a portion of the structure of the flexible display screen 1 will be wound around the shaft 21, so that at least a portion of the flexible display screen 1 can be hidden inside the flexible display device. During the transition of the flexible display device from the folded state to the unfolded state, the flexible display screen 1 can move relative to the shaft 21, and the shaft 21 can rotate relative to the fixed portion 2. A portion of the structure of the flexible display screen 1 can be exposed from an interior of the flexible display device, thereby increasing the displayable screen size of the flexible display device.

The flexible display screen 1 has two opposite ends in an extending direction thereof, one end is fixed to the first screen end fixing member 3 and the other end is fixed to the second screen end fixing member 4. Since the flexible display screen 1 needs to be wound on the shaft 21, the two ends of flexible display screen 1 are located on two sides of the fixed portion 2 in a thickness direction Z of the flexible display device, respectively. Furthermore, it can be seen that the first screen end fixing member 3 and the second screen end fixing member 4 are located on two sides of the fixed portion 2 in the thickness direction Z, respectively.

It should be noted that one of the first screen end fixing member 3 and the second screen end fixing member 4 is located on a side of the fixed portion 2 near the light-emitting face of the flexible display device, the other is located on a side of the fixed portion 2 near a backlight face of the flexible display device, and the embodiments of the present application do not limit this. In order to describe the technical solution of the present application more clearly, the present application will illustrate below by taking the example that the first screen end fixing member 3 is located on the side of the fixed portion 2 near the light-emitting face of the flexible display device, and the second screen end fixing member 4 is located on the side of the fixed portion 2 near the backlight surface of the flexible display device.

Both the first screen end fixing member 3 and the second screen end fixing member 4 are slidingly connected to the fixed portion 2, that is, any two of the first screen end fixing member 3, the second screen end fixing member 4 and the fixed portion 2 can slide relative to each other. When the flexible display device transitions between the folded state and the unfolded state, generally, moving directions of the first screen end fixing member 3 and the second screen end fixing member 4 are opposite to each other. Specifically, during the transition from the folded state to the unfolded state, the first screen end fixing member 3 moves away from the shaft 21, while the second screen end fixing member 4 moves towards the shaft 21. The transition of the flexible display device from the unfolded state to the folded state is the opposite process, and the embodiments of the present application will not be repeated.

The first elastic member 22 is mounted between the fixed portion 2 and the first screen end fixing member 3, and provides the first elastic force F1 to the first screen end fixing member 3. Since one end of the flexible display screen 1 is fixed to the first screen end fixing member 3, the first elastic force F1 exerted by the first elastic member 22 can be transmitted to the flexible display screen 1. The second elastic member 23 is mounted between the fixed portion 2 and the second screen end fixing member 4, and provides the second elastic force F2 to the second screen end fixing member 4. Since the other end of the flexible display screen 1 is fixed to the second screen end fixing member 4, the second elastic force F2 exerted by the second elastic member 23 can also be transmitted to the flexible display screen 1.

The embodiments of the present application do not limit the structures and sizes of the first elastic member 22 and the second elastic member 23, the connection method of the first elastic member 22 to the fixed portion 2 and the first screen end fixing member 3, and the connection method of the second elastic member 23 to the fixed portion 2 and the second screen end fixing member 4. Exemplarily, both the first elastic member 22 and the second elastic member 23 are spring structures.

The first elastic force F1 can at least partially maintain equilibrium with the second elastic force F2, that is, an angle between the first elastic force F1 and the second elastic force F2 is less than 90°. The following embodiments of the present application will specifically by taking an example that the angle between the first elastic force F1 and the second elastic force F2 is 0, that is, a direction of the first elastic force F1 is the same as that of the second elastic force F2.

The direction of the first elastic force F1 is the same as the direction of the second elastic force F2, that is, force directions of the first screen end fixing member 3 and the second screen end fixing member 4 are the same. Furthermore, force directions of two opposite end of the flexible display screen 1 are the same. Since the two ends of the flexible display screen 1 are located on two sides of the fixed portion 2 in the thickness direction Z, the first elastic force F1 and the second elastic force F2 causes the two ends of the flexible display screen 1 to tend to move away from the shaft 21, that is, the flexible display screen 1 tends to stretch, thereby keeping the exposed display face flat.

Therefore, the first elastic force F1 and the second elastic force F2 exert the stretching forces to the two ends of the flexible display screen 1, respectively. The first elastic force F1 can maintain equilibrium with the friction force generated between a side of the fixed portion 2 facing the first screen end fixing member 3 and the flexible display screen 1, and the second elastic force F2 can maintain equilibrium with the friction force generated between a side of the fixed portion 2 facing the second screen end fixing member 4 and the flexible display screen 1. The first elastic force F1 and the second elastic force F2 can reduce the friction impact of two sides of the fixed portion 2 on the flexible display screen 1, thereby reducing the risk of the excessive force difference between two ends of the flexible display screen 1 caused by the friction force, and improving the reliability of the flexible display device.

In addition, during the process of the flexible display device transitioning between the folded state and the unfolded state, the first elastic member 22 and the second elastic member 23 can provide a certain stretching force to the flexible display screen 1, which can be more conducive to the deformation of the flexible display device.

It should be noted that the embodiments of the present applications do not limit the relationship between the magnitudes of the first elastic force F1 and the second elastic force F2, that is, the first elastic force F1 can be larger than, less than, or equal to the second elastic force F2. In addition to the above-mentioned parts, the flexible display device can further includes other parts according to the actual using needs. Exemplarily, the flexible display device further includes a circuit board fixing member 5 for mounting a flexible circuit board, which is fixedly connected to the first screen end fixing member 3. A decorative part 10*a*, a pressure frame structure 10*b*, a bottom cover 10*c*, an electronic assembly 10*d*, a control key 10*e* and a control key mounting support 10*f* for mounting the control key 10*e* are arranged outside the stretching-and-retracting structure S. The pressure frame structure 10*b* and the bottom cover 10*c* can jointly press and fix the stretching-and-retracting structure S, the electronic assembly 10*d* and the control key 10*e*. The decorative part 10*a* can be used to decorate to improve the aesthetics of the flexible display device.

In some embodiments, referring to FIG. 7 to FIG. 11, a first guiding-and-sliding mechanism D1 is arranged between the fixed portion 2 and the first screen end fixing member 3, and a second guiding-and-sliding mechanism D2 is arranged between the fixed portion 2 and the second screen end fixing member 4.

The first guiding-and-sliding mechanism D1 is used to achieve the sliding connection between the fixed portion 2 and the first screen end fixing member 3. The first screen end fixing member 3 can move relative to the fixed portion 2 in the first direction X through the first guiding-and-sliding mechanism D1. The second guiding-and-sliding mechanism D2 is used to achieve the sliding connection between the fixed portion 2 and the second screen end fixing member 4. The second screen end fixing member 4 can move relative to the fixed portion 2 in the first direction X through the second guiding-and-sliding mechanism D2.

The embodiments of the present application do not limit the structures of the first guiding-and-sliding mechanism D1 and the second guiding-and-sliding mechanism D2.

Exemplarily, the first guiding-and-sliding mechanism D1 includes a sliding block and a sliding groove which cooperate with each other. One of the sliding block and the sliding groove is located on the fixed portion 2, and the other is located on the first screen end fixing member 3. The second guiding-and-sliding mechanism D2 is similar with the first guiding-and-sliding mechanism D1 and will not be repeated in the embodiments of the present application.

It should be noted that the embodiments of the present application do not limit the number of first guide guiding-and-sliding mechanisms D1. There may be one or more first guiding-and-sliding mechanisms D1. In the case that there are a plurality of first guiding-and-sliding mechanisms D1, the plurality of first guiding-and-sliding mechanisms D1 are arranged side by side to improve the reliability of the sliding connection between the first screen end fixing member 3 and the fixed portion 2. The second guiding-and-sliding mechanism D2 is similar with the first guiding-and-sliding mechanism D1.

Figure 7:
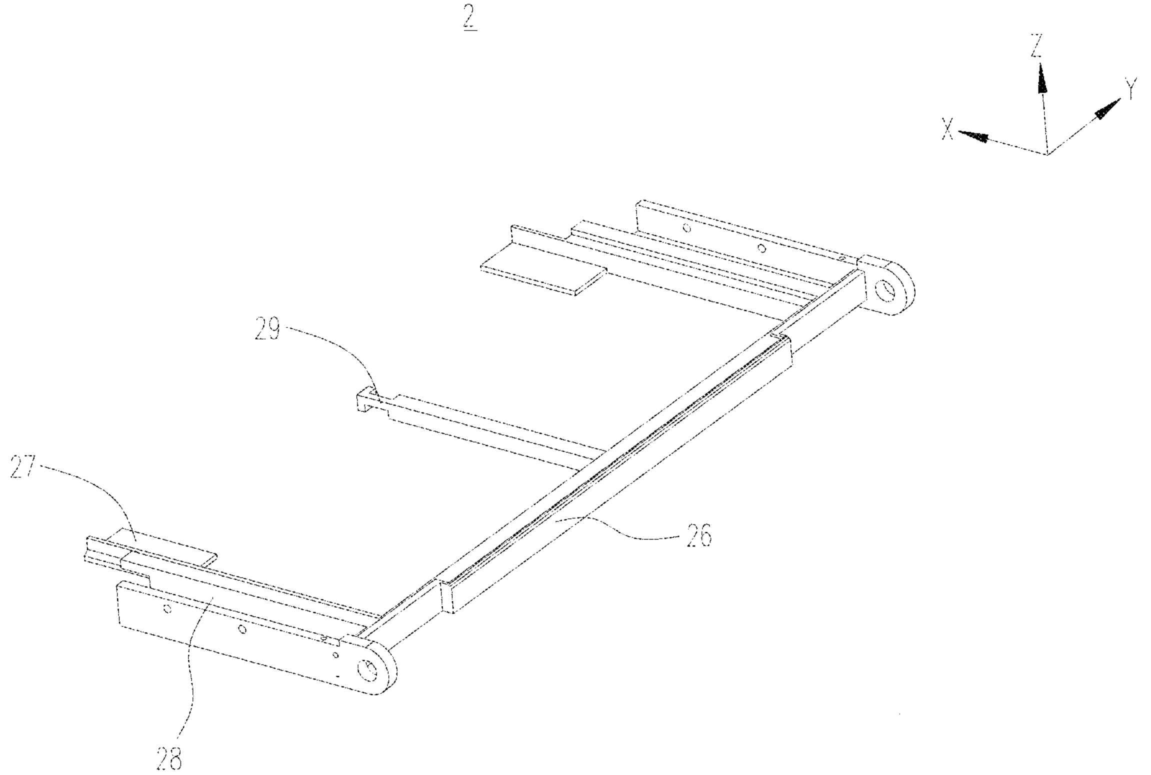
FIG. 7 shows a structural schematic view of a fixed portion of a flexible display device according to some embodiments of the present application.
Figure 8:
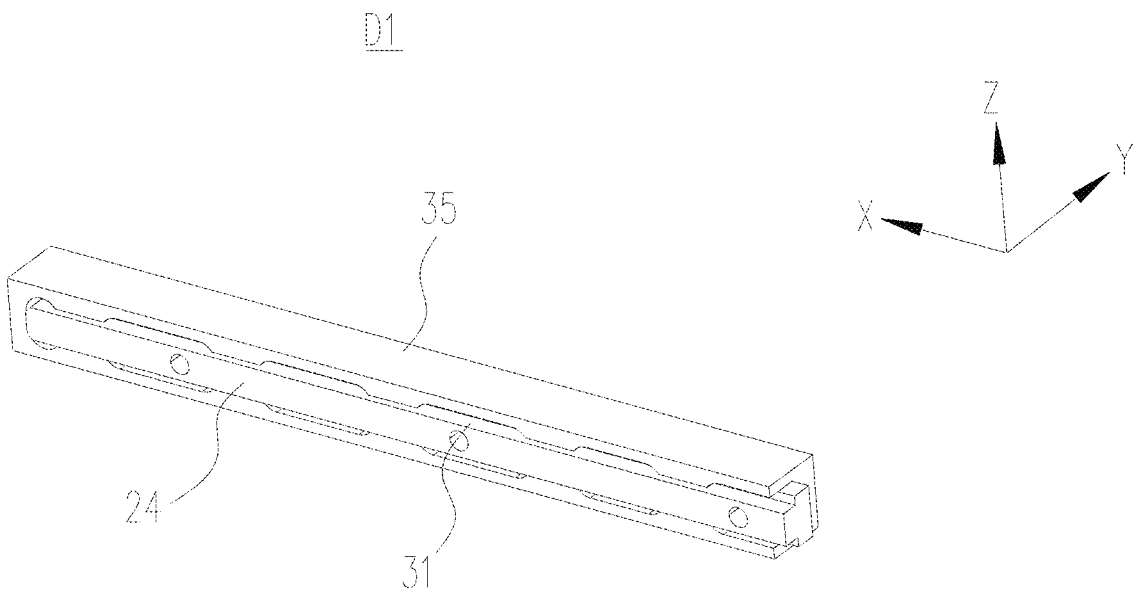
FIG. 8 shows a structural schematic view of a first guiding-and-sliding mechanism of a flexible display device according to some embodiments of the present application.
Figure 11:
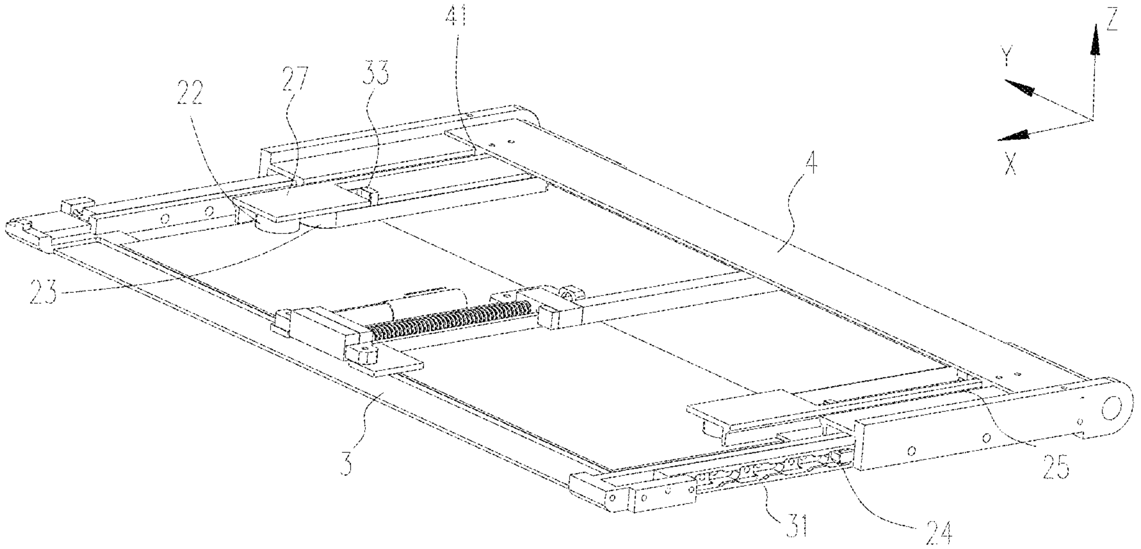
FIG. 11 shows a structural schematic view of a stretching-and-retracting structure of a flexible display device in an unfolded state according to some embodiments of the present application.

In some embodiments, as shown in FIG. 7, FIG. 8 and FIG. 11, the first guiding-and-sliding mechanism D1 includes a first guiding-and-sliding block 24 arranged on the fixed portion 2 and a first sliding groove 31 arranged on the first screen end fixing member 3 and extending in a first direction X, and the first guiding-and-sliding block 24 is slidably disposed on the first sliding groove 31.

The first sliding groove 31 is located on the first screen end fixing member 3. Exemplarily, the first screen end fixing member 3 includes a first sliding groove part 35, the first sliding groove 31 is arranged on the first sliding groove part 35, and the first sliding groove part 35 is detachably connected to other structures in the first screen end fixing member 3. The first guiding-and-sliding block 24 is located on the fixed portion 2, and optionally, the first guiding-and-sliding block 24 can be detachably connected to other structures of the fixed portion 2.

The first sliding groove 31 extends in the first direction X, and the first guiding-and-sliding block 24 is disposed inside the first sliding groove 31 and can slide relative to the first sliding groove 31 in the first direction X. The first screen end fixing member 3 can move relative to the fixed portion 2 in the first direction X through the coordination between the first sliding groove 31 and the first guiding-and-sliding block 24. The first direction X intersects with the thickness direction Z. Exemplarily, the first direction X is perpendicular to the thickness direction Z, and the first direction X is a retracting-and-stretching direction of the flexible display device.

Figure 10:
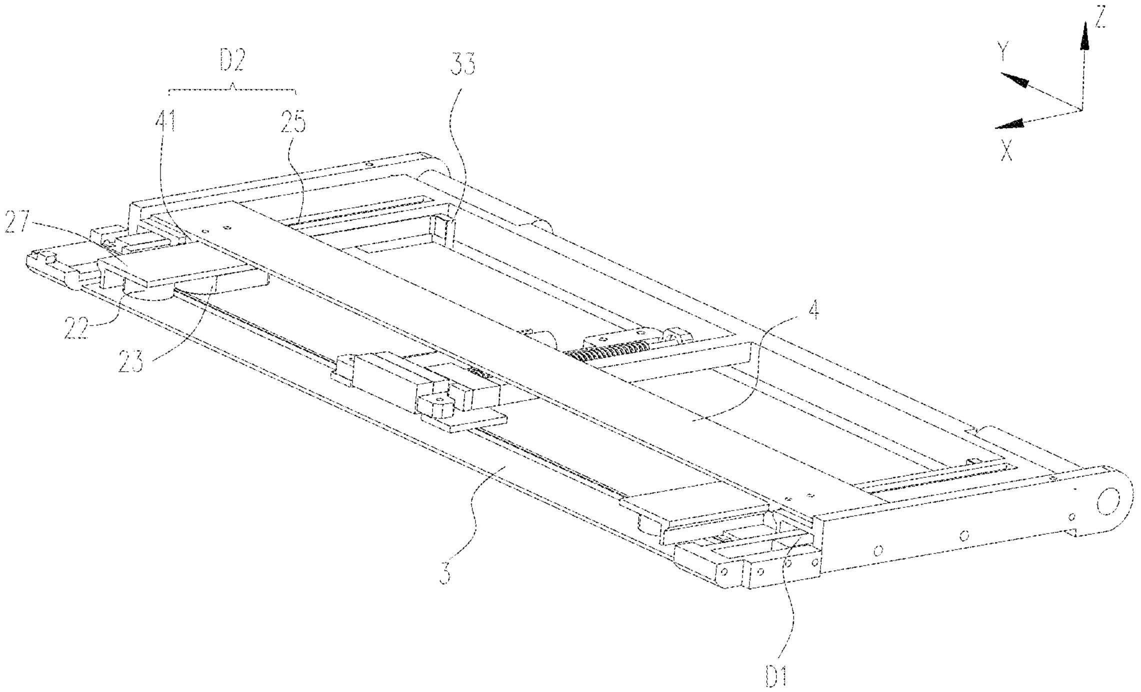
FIG. 10 shows a structural schematic view of a stretching-and-retracting structure of a flexible display device in a folded state according to some embodiments of the present application.

In some embodiments, as shown in FIG. 10, the second guiding-and-sliding mechanism D2 includes a second sliding groove 25 arranged on the fixed portion 2 and extending in the first direction X and a second guiding-and-sliding block 41 arranged on the second screen end fixing member 4, and the second guiding-and-sliding block 41 is slidably disposed on the second sliding groove 25.

The second sliding groove 25 is located on the fixed portion 2 and extends in the first direction X, the second guiding-and-sliding block 41 is located on the second screen end fixing member 4, and the second guiding-and-sliding block 41 can relatively slide in the second sliding groove 25 in the first direction X. The second screen end fixing member 4 can move relative to the fixed portion 2 in the first direction X through the coordination between the second sliding groove 25 and the second guiding-and-sliding block 41.

In some embodiments, as shown in FIG. 7, FIG. 8 and FIG. 10, the fixed portion 2 includes a guiding-and-sliding mounting part 28, and both the first guiding-and-sliding block 24 and the second sliding groove 25 are arranged on the guiding-and-sliding mounting part 28.

The guiding-and-sliding mounting part 28 is a portion on the fixed portion 2 for arranging the first guiding-and-sliding block 24 and the second sliding groove 25. The second sliding groove 25 can be formed by digging out the guiding-and-sliding mounting part 28, and the first guiding-and-sliding block 24 can be fixedly connected to the guiding-and-sliding mounting part 28 through the bolt connection or other means. Exemplarily, the first guiding-and-sliding block 24 and the second sliding groove 25 are arranged side by side in the second direction Y.

In the embodiments of the present application, the guiding-and-sliding mounting part 28 simultaneously realizes the mounting of the first guiding-and-sliding block 24 and the mounting of the second sliding groove 25. Furthermore, the first guiding-and-sliding block 24 and the second sliding groove 25 can share a portion of structure of the guiding-and-sliding mounting part 28 for mounting. This design can reduce the space inside the flexible display device occupied by the first guiding-and-sliding mechanism D1 and the second guiding-and-sliding mechanism D2, and improve the space utilization efficiency.

In some embodiments, the fixed portion 2 further includes a support beam 26 extending in the second direction Y, the first direction X intersects with the second direction Y, and the guiding-and-sliding mounting part 28 is connected to the support beam 26.

The support beam 26 is connected to the guiding-and-sliding mounting part 28 and maintained at a fixed position. The support beam 26 extends in the second direction Y, and the first direction X intersects with the second direction Y Exemplarily, the first direction X, the second direction Y and the thickness direction Z are perpendicular to one another.

Since the support beam 26 extends in the second direction Y, if there are a plurality of guiding-and-sliding mounting parts 28, the plurality of guiding-and-sliding mounting parts 28 will be arranged side by side in the second direction Y Exemplarily, there are two guiding-and-sliding mounting parts 28 which are arranged at two ends of the support beam 26 in the second direction Y.

In the embodiments of the present application, by arranging the support beam 26, the plurality of guiding-and-sliding mounting parts 28 can be arranged on the fixed portion 2, and the relative positions among the plurality of guiding-and-sliding mounting parts 28 can be fixed, thereby improving the reliability of the sliding connection between the fixed portion 2 and the first screen end fixing member 3 and between the fixed portion 2 and the second screen end fixing member 4.

Figure 4:
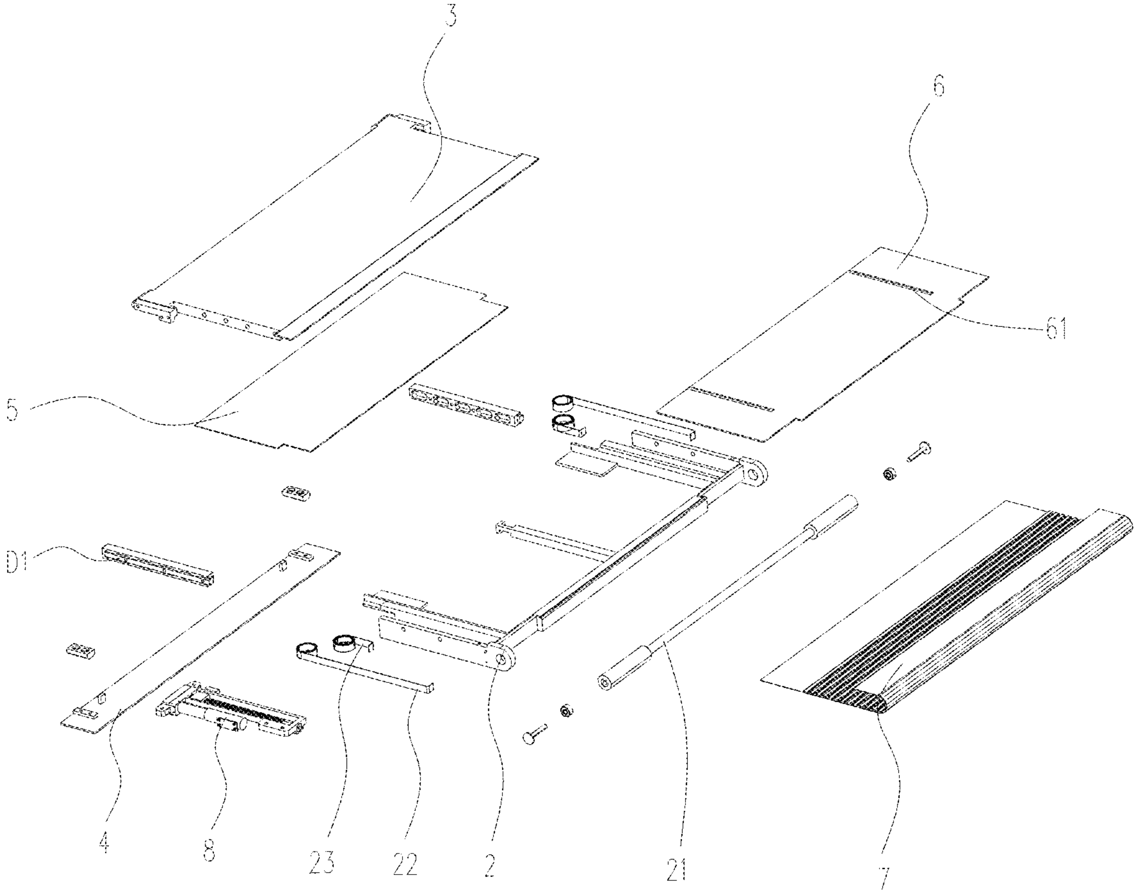
FIG. 4 shows an exploded structural schematic view of a stretching-and-retracting structure of a flexible display device according to some embodiments of the present application.

In some embodiments, as shown in FIG. 4 and FIG. 7, the shaft 21 and the guiding-and-sliding mounting part 28 are located on two sides of the support beam 26 in the first direction X.

The support beam 26 is used to connect the guiding-and-sliding mounting part 28, and the support beam 26 also separates the shaft 21 from the guiding-and-sliding mounting part 28, so that the shaft 21 and the guiding-and-sliding mounting part 28 are arranged on two sides of the support beam 26 in the first direction X, respectively. This design can reduce the impact of the movement of the first screen end fixing member 3 and the second screen end fixing member 4 on the rotation of the shaft 21, and improve the reliability of the internal structures of the flexible display device.

In some optional embodiments, the fixed portion 2 further includes a lifting lug structure connected to the support beam 26. The lifting lug structure is located on a side of the support beam 26 away from the guiding-and-sliding mounting part 28. The lifting lug structure is provided with a through hole penetrating through in the first direction X, and the shaft 21 is rotatably connected to the through hole of the lifting lug structure by a nut, a bearing and other structures.

In some embodiments, the fixed portion 2 further includes an elastic member mounting part 27 connected to the guiding-and-sliding mounting part 28, at least one of the first elastic member 22 or the second elastic member 23 is mounted on the elastic member mounting part 27, an output end of the first elastic member 22 is connected to the first screen end fixing member 3, and an output end of the second elastic member 23 is connected to the second screen end fixing member 4.

The elastic member mounting part 27 is connected to the guiding-and-sliding mounting part 28, and the guiding-and-sliding mounting part 28 is connected to the support beam 26. The embodiments of the present application do not limit a relative positional relationship between the support beam

26 and the elastic member mounting part 27. Exemplarily, the support beam 26 and the elastic member mounting part 27 are spaced apart from each other in the first direction X.

The elastic member mounting part 27 is used to mount at least one of the first elastic member 22 or the second elastic member 23, and optionally, both the first elastic member 22 and the second elastic member 23 are fixed to the elastic member mounting part 27. The embodiments of the present application do not limit the connection relationship between the first elastic member 22 or the second elastic member 23 and the elastic member mounting part 27. Exemplarily, the first elastic member 22 and the second elastic member 23 are fixed to the elastic member mounting part 27 by welding or bonding.

The output end of the first elastic member 22 is connected to the first screen end fixing member 3 and can synchronously move with the first screen end fixing member 3. The first elastic member 22 exerts the first elastic force F1 to the first screen end fixing member 3 through the output end. The connection method between the output end of the first elastic member 22 and the first screen end fixing member 3 includes but is not limited to bonding, welding or the like.

The output end of the second elastic member 23 is connected to the second screen end fixing member 4 and can synchronously move with the second screen end fixing member 4. The second elastic member 23 exerts the second elastic force F2 to the second screen end fixing member 4 through the output end. The connection method between the output end of the second elastic member 23 and the second screen end fixing member 4 includes but are not limited to bonding, welding or the like.

Figure 12:
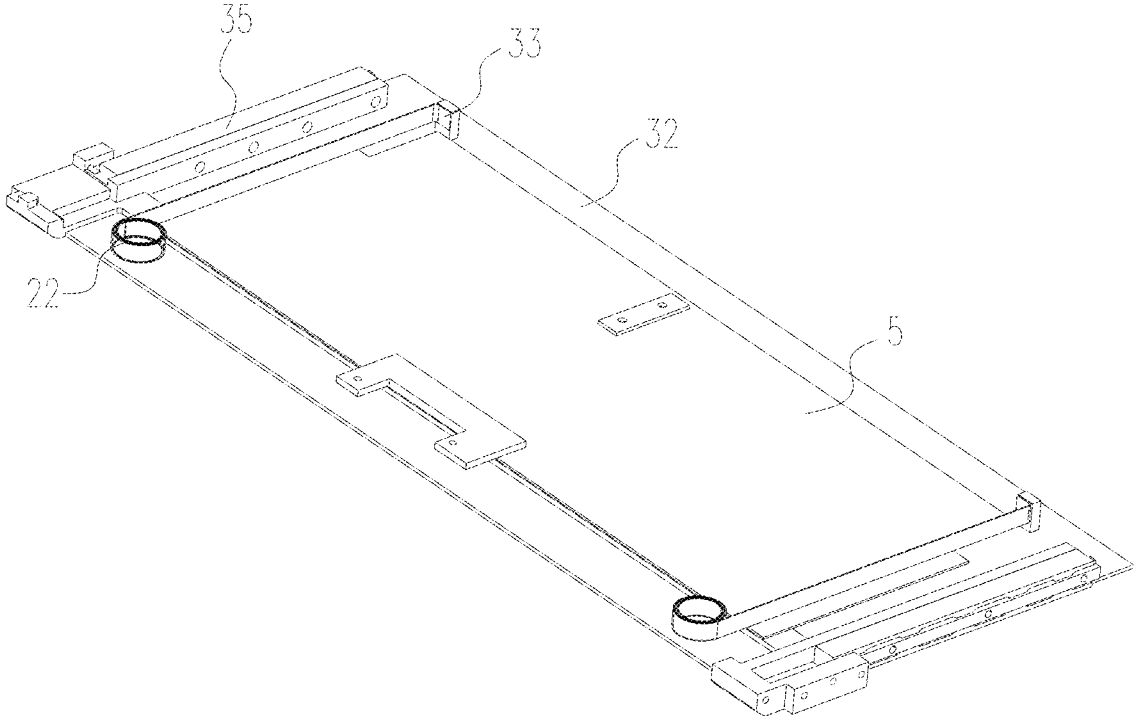
FIG. 12 is a schematic view of a cooperation structure between a first elastic member and a first screen end fixing member in a flexible display device according to some embodiments of the present application.

In some embodiments, referring to FIG. 12, the first screen end fixing member 3 includes a first body 32 and a first connecting part 33 arranged on a side of the first body 32 facing the second screen end fixing member 4. The output end of the first elastic member 22 is connected to the first connecting part 33.

The first body 32 may be a plate-like structure, and the first connecting part 33 is connected to the first body 32. Similarly, the first sliding groove part 35 can also be connected to the first body 32, and the first sliding groove part 35 and the first connecting part 33 are misaligned with each other on the first body 32. The first connecting part 33 is used to fixedly connect the output end of the first screen end fixing member 3 with the first elastic member 22. The first elastic member 22 exerts the first elastic force F1 to the first screen end fixing member 3 through the first connecting part 33.

Figure 9:
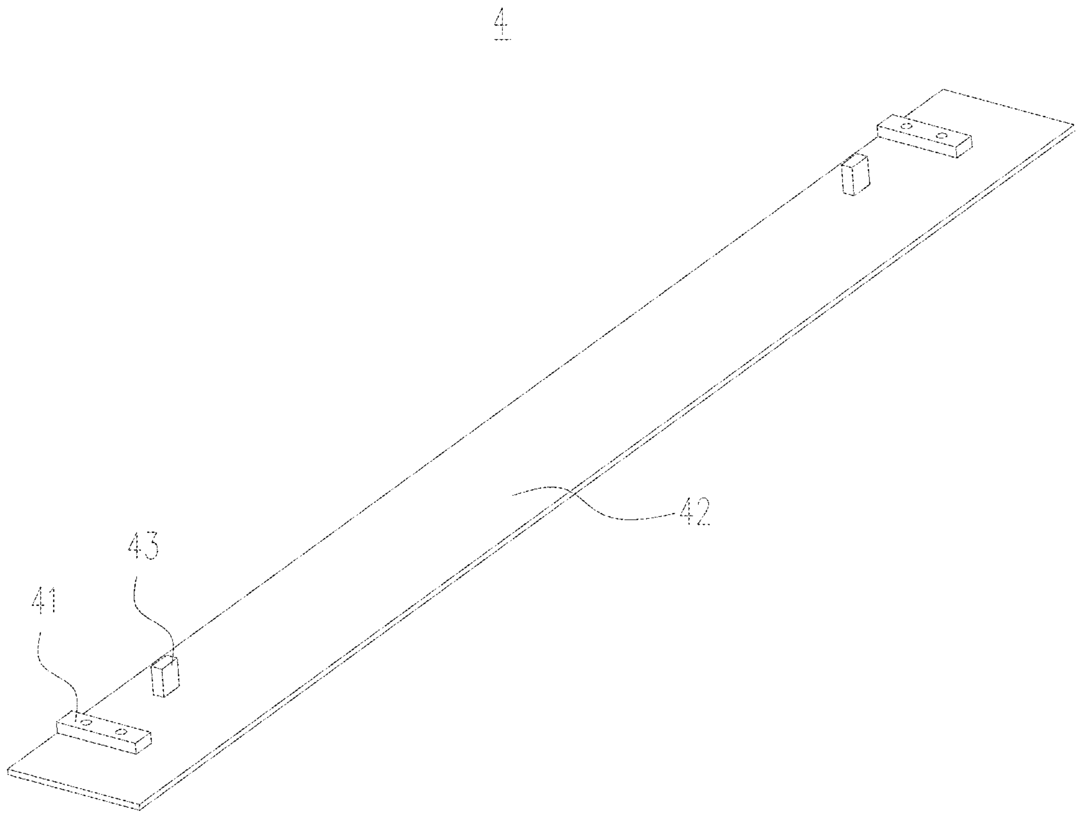
FIG. 9 shows a structural schematic view of a second screen end fixing member of a flexible display device according to some embodiments of the present application.

In some embodiments, as shown in FIG. 9 to FIG. 11, the second screen end fixing member 4 includes a second body 42 and a second connecting part 43 arranged on a side of the second body 42 facing the first screen end fixing member 3. The output end of the second elastic member 23 is connected to the second connecting part 43.

Similar to the first body 32, the second body 42 can also be a plate-like structure. The second connecting part 43 is connected to the second body 42, and similarly, the second guiding-and-sliding block 41 can also be connected to the second body 42. The second connecting part 43 and the second guiding-and-sliding block 41 are located on the same side of the second body 42 in the thickness direction Z and are misaligned with each other. The second connecting part 43 is used to achieve the connection and fixation between the second screen end fixing member 4 and the output end of the second elastic member 23. The second elastic member 23 exerts the second elastic force F2 to the second screen end fixing member 4 through the second connecting part 43.

Figure 5:
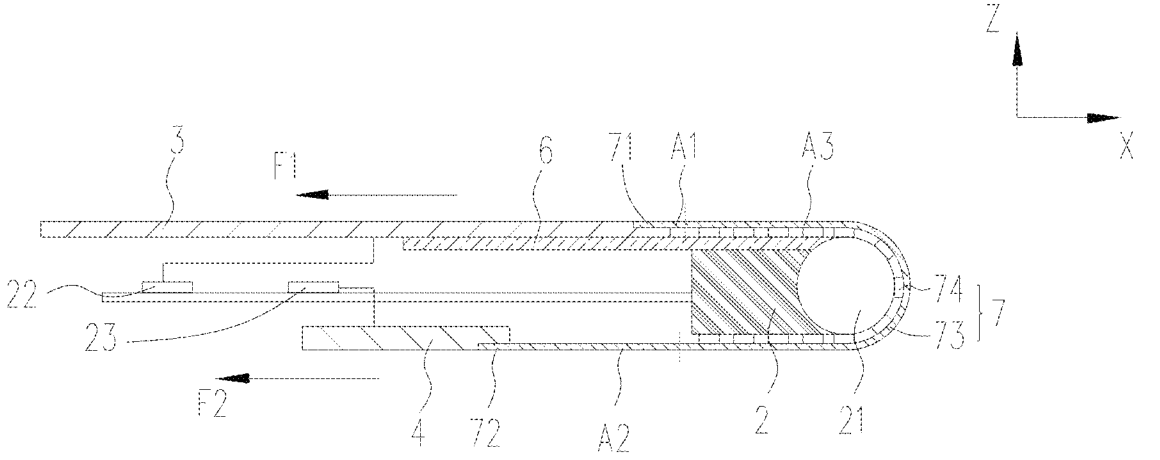
FIG. 5 shows a brief structural schematic view of a stretching-and-retracting structure of a flexible display device in a folded state according to some embodiments of the present application.
Figure 6:
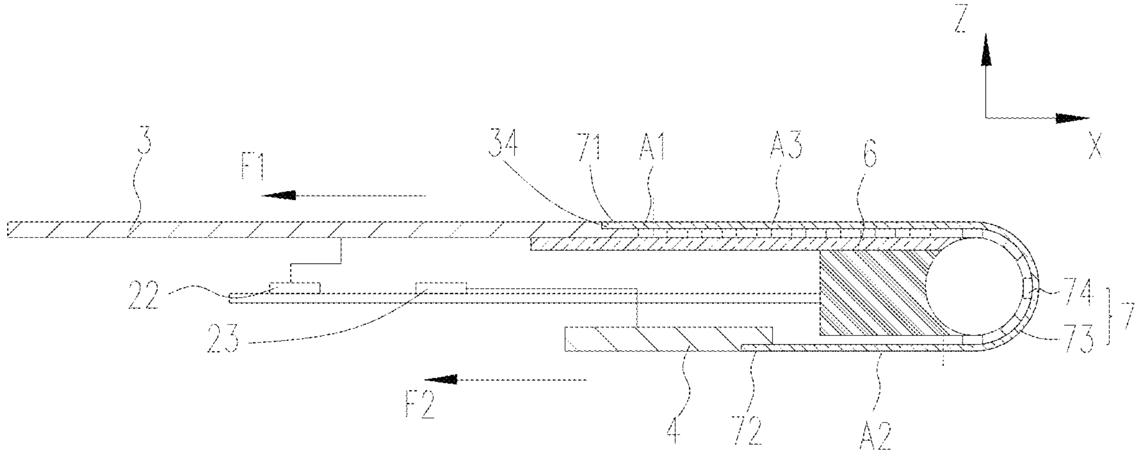
FIG. 6 shows a brief structural schematic view of a stretching-and-retracting structure of a flexible display device in an unfolded state according to some embodiments of the present application.

In some embodiments, as shown in FIG. 4 to FIG. 6, the flexible display device further includes a stretching part support member 6. The stretching part support member 6 is fixed to the fixed portion 2. The stretching part support member 6 is arranged on the side of the first body 32 facing the second screen end fixing member 4 and provided with an avoidance groove 61, and the first connecting part 33 is configured to relatively slide in the avoidance groove 61.

The stretching part support member 6 is fixed to the fixed portion 2, and can slide relative to the first screen end fixing member 3. During the transition of the flexible display device from the folded state to the unfolded state, the first screen end fixing member 3 may slide relative to the fixed portion 2. A portion of the structures in the flexible display screen 1 will be located above the fixed portion 2 and display a specific image. However, since the fixed portion 2 is not a complete face structure, it is difficult to meet the needs of supporting flexible display screen 1 merely by relying on the fixed portion 2.

In this case, the embodiments of the present application provide the stretching part support member 6, which is connected and fixed to a fixed portion 2, that is, the stretching part support member 6 can slide relative to the first screen end fixing member 3, and the stretching part support member 6 can replace the fixed portion 2 to provide the positive support for the flexible display screen 1. Therefore, in the unfolded state, a portion of the flexible display screen 1 used to achieve the display effect can be better supported, thereby improving the reliability and service life of the flexible display device.

In addition, since both the stretching part support member 6 and the first connecting part 33 are located on the side of the first body 32 facing the second screen end fixing member 4, and the first screen end fixing member 3 can move relative to the stretching part support member 6, the first connecting part 33 is prone to interference with the stretching part support member 6 when moves. In order to improve the stretching-and-retracting reliability of the flexible display device, the avoidance groove 61 is arranged on the stretching part support member 6 in the embodiments of the present application. The avoidance groove 61 extends in the first direction X, and at least part of the first connecting part 33 is located inside the avoidance groove 61 and can slide relative to the avoidance groove 61. During the stretching-and-retracting process of the flexible display device, this design can avoid the contact between the first screen end fixing member 3 and the stretching part support member 6 and improve the reliability.

In some embodiments, as shown in FIG. 5, in the folded state of the flexible display device, the stretching part support member 6 is at least partially overlapped with the first screen end fixing member 3 in the thickness direction Z.

In the embodiments of the present application, the description "the stretching part support member 6 is at least partially overlapped with the first screen end fixing member 3 in the thickness direction Z" refers that in the folded state, there is an overlap region between an orthogonal projection of the stretching part support member in the thickness direction Z and an orthogonal projection of the first screen end fixing 3 in the thickness direction Z.

Since the stretching part support member 6 can at least partially overlap with the first screen end fixing member 3 in the thickness direction Z in the folded state, the stretching part support member 6 can help the first screen end fixing member 3 jointly support the display portion of the flexible display screen 1 in the folded state, thereby improving the reliability of the flexible display device in the folded state.

At the same time, during the transition of the flexible display device from the folded state to the unfolded state, the size of the overlapping area between the orthogonal projection of the stretching part support member 6 and the orthogonal projection of the first screen end fixing 3 in the thickness direction Z gradually decreases. A portion of the stretching part support member 6 that is beyond the first screen end fixing 3 also supports the flexible display screen 1.

It should be noted that in the unfolded state of the flexible display device, the stretching part support member 6 is at least partially overlapped with the first screen end fixing member 3 in the thickness direction Z, or not overlapped with the first screen end fixing member 3 in the thickness direction Z. The embodiments of the present application do not limit this.

Figure 13:
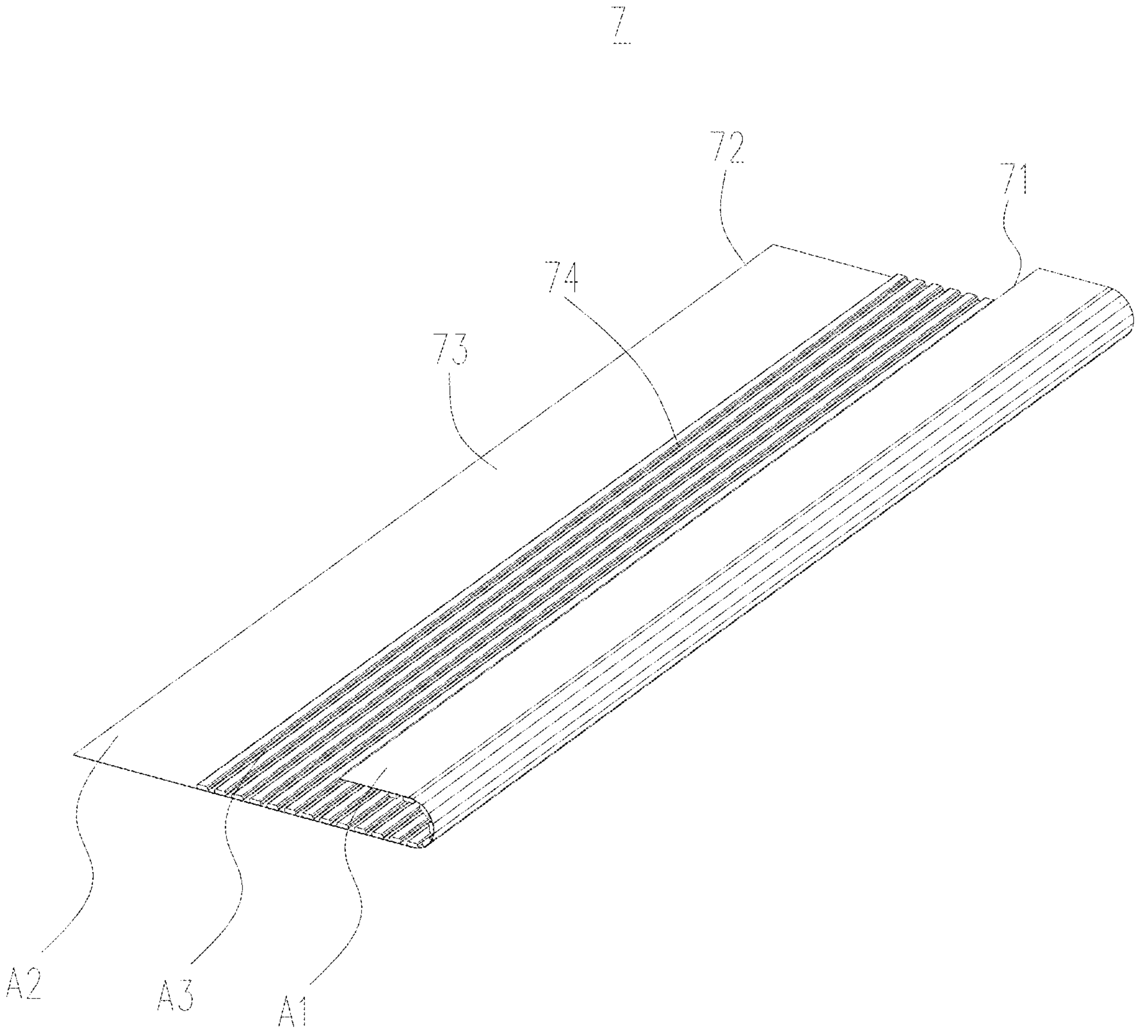
FIG. 13 shows a structural schematic view of a bending support member of a flexible display device according to some embodiments of the present application.
Figure 14:
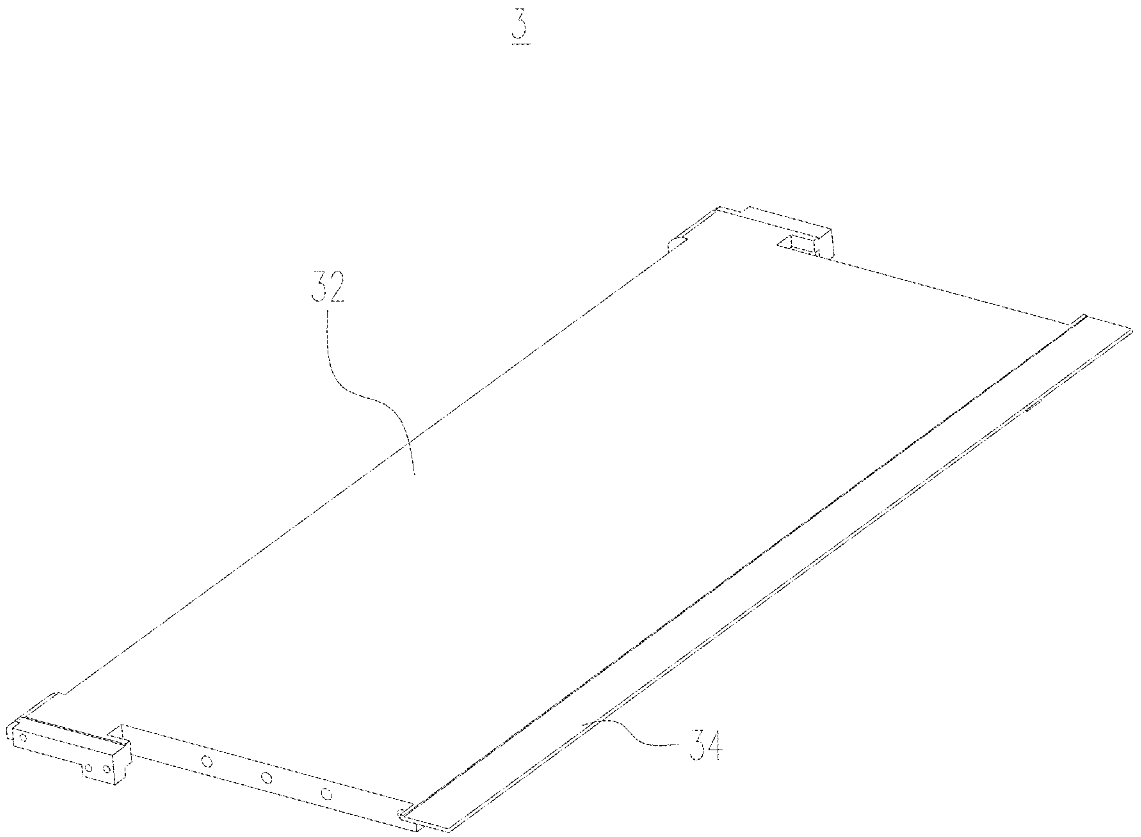
FIG. 14 shows a structural schematic view of a first screen end fixing member of a flexible display device according to some embodiments of the present application.

In some embodiments, referring to FIG. 5, FIG. 6 and FIG. 13, the flexible display device further includes a bending support member 7, which includes a first end 71 and a second end 72 opposite to each other in an extending direction thereof, the first end 71 is fixed to the first screen end fixing member 3, and the second end 72 is fixed to the second screen end fixing member 4.

Similar to the stretching part support member 6, the bending support member 7 is also used to support the flexible display screen 1. The difference is that the bending support member 7 can be relatively bent and cover at least a portion of structure of the shaft 21. Specifically, the bending support member 7 includes the first end 71 and the second end 72. The first end 71 can be fixed to the first screen end fixing member 3 by welding, bonding or the like; then the bending support member 7 extends from the first end 71 to the position of the shaft 21, covers at least a portion of structure of the shaft 21 and is bent to a side of the flexible display device near a backlight face; finally, the second end 72 of the bending support member 7 is fixedly connected to the second screen end fixing member 4 by welding, bonding or the like.

During the process of unfolding or partially unfolding the flexible display device, the first screen end fixing member 3 can drive the first end 71 of the bending support member 7 to move away from the shaft 21, and the second screen end fixing member 4 can drive the second end 72 of the bending support member 7 to move towards the shaft 21. The size of the bending support member 7 located on a side of the fixed portion 2 near the first screen end fixing member 3 gradually increases, and the size of the displayable screen of the flexible display device increases.

In the embodiments of the present application, the bending support member 7 can support the flexible display screen 1 at the position of the shaft 21, thereby improving the reliability of the flexible display device during the stretching-and-retracting process. The embodiments of the present application do not limit the material and the size of the bending support member 7. The bending support member 7 may be a flexible structure, which can allow for bending deformation; alternatively, the bending support member 7 may be a bendable rigid structure, thereby improving the support effect on the flexible display screen 1.

In some embodiments, at least a portion of structure of the bending support member 7 is in contact with the stretching part support member 6.

Since the first end 71 of the bending support member 7 is connected to the first screen end fixing member 3, at least a portion of structure in the bending support member 7 is located on the side of the fixed portion 2 facing the first screen end fixing member 3, and at least a portion of structure of the bending support member 7 is opposite to the stretching part support member 6 in the thickness direction Z.

On the basis, in the embodiments of the present application, a portion of structure of the bending support member 7 is in contact with the stretching part support member 6. The flexible display screen 1 can be supported by both the bending support member 7 and the stretching part support member 6 at the position of the stretching part support member 6, thereby achieving a dual support effect and improving the support effect on the flexible display screen 1 from the interior of the flexible display device.

In some embodiments, an end of the flexible display screen 1 is fixed to an end of the first body 32 away from the shaft 21.

Since the first body 32 itself is a plate-like structure, and the end of the flexible display screen 1 is fixed to the end of the first body 32 away from the shaft 21, most of the structures of the first body 32 in the first screen end fixing member 3 can support the flexible display screen 1, thereby reducing the risk of deformation of the flexible display screen 1 under an external force.

In some embodiments, an end of the flexible display screen 1 is fixed to an end of the second body 42 away from the shaft 21.

Since the second body 42 itself is a plate-like structure, and the end of the flexible display screen 1 is fixed at the end of the second body 42 away from the shaft 21, most of the structure of the second body 42 in the first screen end fixing member 3 can support the flexible display screen 1, thereby reducing the risk of deformation of the flexible display screen 1 under an external force.

In some embodiments, the stretching part support member 6 is arranged on a side of the first screen end fixing member 3 near the second screen end fixing member 4, the bending support member 7 includes a flexible support part 73 and a rigid support part 74 arranged on a side of the flexible support part 73 near the stretching part support member 6, and the rigid support part 74 is in contact with the stretching part support member 6.

The bending support member 7 includes the flexible support part 73 and the rigid support part 74. The flexible support part 73 can meet the bending needs of the bending support member 7, and the rigid support part 74 can improve the support strength of the bending support member 7. The two parts can cooperate with each other to meet the needs of the flexible display device.

In the embodiments of the present application, the rigid support part 74 is arranged on the flexible support part 73, and arranged in a gap space between the flexible support part 73 and the stretching part support member 6. The flexible support part 73 can be supported by the rigid support part 74, thereby reducing the risk of deformation of the flexible support part 73 and improving the service life of the flexible display device.

In addition, the rigid support part 74 can also achieve the mutual contact between the bending support part 7 and the stretching part support member 6, thereby achieving a dual support effect on the flexible display screen 1 and improving the reliability of the flexible display device.

In some embodiments, as shown in FIG. 13, there are a plurality of rigid support parts 74, each of the rigid support parts is in a strip shape. The plurality of rigid support parts 74 are spaced from one another in an extending direction of the flexible support part 73.

In general, the bending ability of the flexible support part 73 is relatively strong, while the bending ability of the rigid support part 74 is relatively weak. If the rigid support part 74 is provided as a single plate-like structure, it is difficult for the bending support member 7 to meet the bending needs.

Therefore, in the embodiments of the present application, the plurality of rigid support part 74 are provided and spaced in the extending direction of the flexible support part 73, so that a portion of the flexible support part 73 corresponding to a region between two adjacent rigid support parts 74 can be bent, thereby meeting the bending needs of the bending support member 7. Exemplarily, each of the rigid support parts 74 is a strip-shaped structure that extends and forms in the second direction Y, and the spacing size between any two adjacent rigid support parts 74 remains consistent.

In the embodiments of the present application, by providing the plurality of rigid support parts 74 which are spaced apart from one another, the structural strength needs of the bending support member 7 can be met, the bending needs of the bending support member 7 can be met, and the high practicality and reliability can be achieved.

In some embodiments, the flexible support part includes a third region A3, and a first region A1 and a second region A2 located on two sides of the third region A3 in an extending direction of the bending support member 7, respectively. The rigid support part 74 is arranged in the third region A3, the first end 71 is arranged in the first region A1, and the second end 72 is arranged in the second region A2.

The flexible support part 73 includes at least three regions: the first region A1, the second region A2 and the third region A3. The first end 71 is located within the first region A1, and is used to fixedly connect the bending support member 7 with the first screen end fixing member 3; the second end 72 is located within the second region A2, and is used to fixedly connect the bending support member 7 with the second screen end fixing member 4. The third region A3 is arranged between the first region A1 and the second region A2, and at least a portion of structure of the flexible support part 73 within the third region A3 covers the shaft 21.

In the first region A1 and the second region A2, the flexible support part 73 can directly contact and fix with the first screen end fixing member 3 and the second screen end fixing member 4. Therefore, in the embodiments of the present application, the rigid support part 74 is not arranged within the first region A1 and the second region A2. In the third region A3, since the rigid support part 74 is arranged in the gap space between the flexible support part 73 and the stretching part support member 6, the stretching part support member 6 can provide the support to the third region A3 of the flexible support part 73 through the rigid support part 74, and the flexible display screen 1 can obtain the dual support effect from the stretching part support member 6 and the rigid support part 74 at the position of the third region A3.

In some embodiments, referring to FIG. 5, FIG. 6, FIG. 13 and FIG. 14, a first concaved portion 34 is arranged at an end of the first screen end fixing member 3 near the bending support member 7, the first end 71 of the flexible support part 73 is arranged on the first concaved portion 34, and a thickness of the flexible support part 73 is equal to a depth of the first concaved portion 34.

The "thickness of the flexible support part 73" mentioned in the embodiments of the present application refers to the size of the flexible support part 73 in the thickness direction Z; the "depth of the first concaved portion 34" refers to the size of the first concaved portion 34 in the thickness direction Z.

The first concaved portion 34 on the first screen end fixing member 3 is used to accommodate the first end 71 of the flexible support part 73. On the basis, since the depth of the first concaved portion 34 is consistent with the thickness of the flexible support part 73, the first end 71 of the flexible support part 73 can be fully adapted to the first concaved portion 34, and neither a convex structure nor a concave structure at the connection position appears between the first screen end fixing member 3 and the flexible support part 73. That is, a flat surface can be formed at the connection position between the flexible support part 73 and the first screen end fixing member 3, which can better support the flexible display screen 1.

It should be noted that, similar to the first screen end fixing member 3*a*, the second concaved portion can also be arranged on the second screen end fixing member 4. The second concaved portion can be used to accommodate the second end 72 of the flexible support part 73 and ensure that a flat surface can be formed at the connection position between the flexible support part 73 and the second screen end fixing member 4, which can better support the flexible display screen 1.

Figure 15:
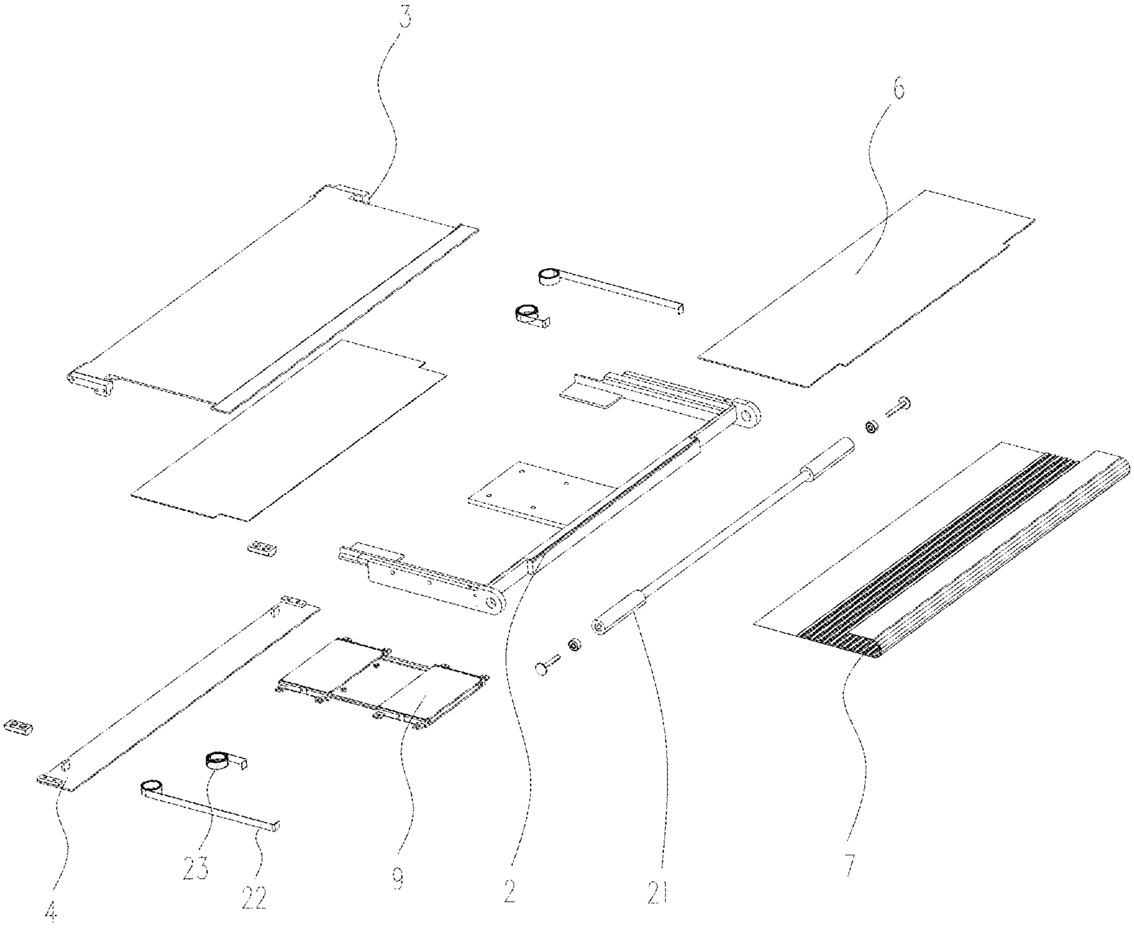
FIG. 15 shows an exploded structural schematic view of a stretching-and-retracting structure of a flexible display device according to other embodiments of the present application.

In some embodiments, referring to FIG. 4 and FIG. 15, the flexible display device further includes at least one of a power supply structure 8 or a stress balancing structure 9. The power supply structure 8 and the stress balancing structure 9 are arranged between the first screen end fixing member 3 and the fixed portion 2, or between the second screen end fixing member 4 and the fixed portion 2, or between the fixed portion 2 and the shaft 21. The power supply structure 8 is configured to provide a driving force for the relative movement between the fixed portion 2 and the first screen end fixing member 3 and an anchoring force (a force that maintains the relative position unchanged) when the fixed portion 2 is fixed relative to the first screen end fixing member 3. The stress balancing structure 9 is configured to provide the anchoring force when the fixed portion 2 is fixed relative to the first screen end fixing member 3.

The power supply structure 8 is a structure that can actively provide the power to the fixed portion 2 or the first screen end fixing member 3, and the embodiments of the present application do not limit the specific position of the power supply structure 8. The power supply structure 8 can be located between the first screen end fixing member 3 and the fixed portion 2, or between the second screen end fixing member 4 and the fixed portion 2, or between the fixed portion 2 and the shaft 21, as long as the power supply structure 8 can provide the power to at least one of the fixed portion 2 or the first screen end fixing member 3.

The power supply structure 8 can achieve the automation of the folding or unfolding of the flexible display device. In addition, when the flexible display device is in the folded state or the unfolded state, the power supply structure 8 can also provide a certain stress to ensure that the fixed portion 2 and the first screen end fixing member 3 remain relatively fixed.

The stress balancing structure 9 is capable of providing a certain resistance force to the fixed portion 2 or the first screen end fixing member 3 during the stretching-and-retracting process of the flexible display device, so as to make the fixed portion 2 or the first screen end fixing member 3 move stably. In addition, when the flexible display device is in the folded state or the unfolded state, the stress balancing structure 9 can further provide a certain stress to ensure that the fixed portion 2 and the first screen end fixing member 3 remain relatively fixed.

Figure 16:
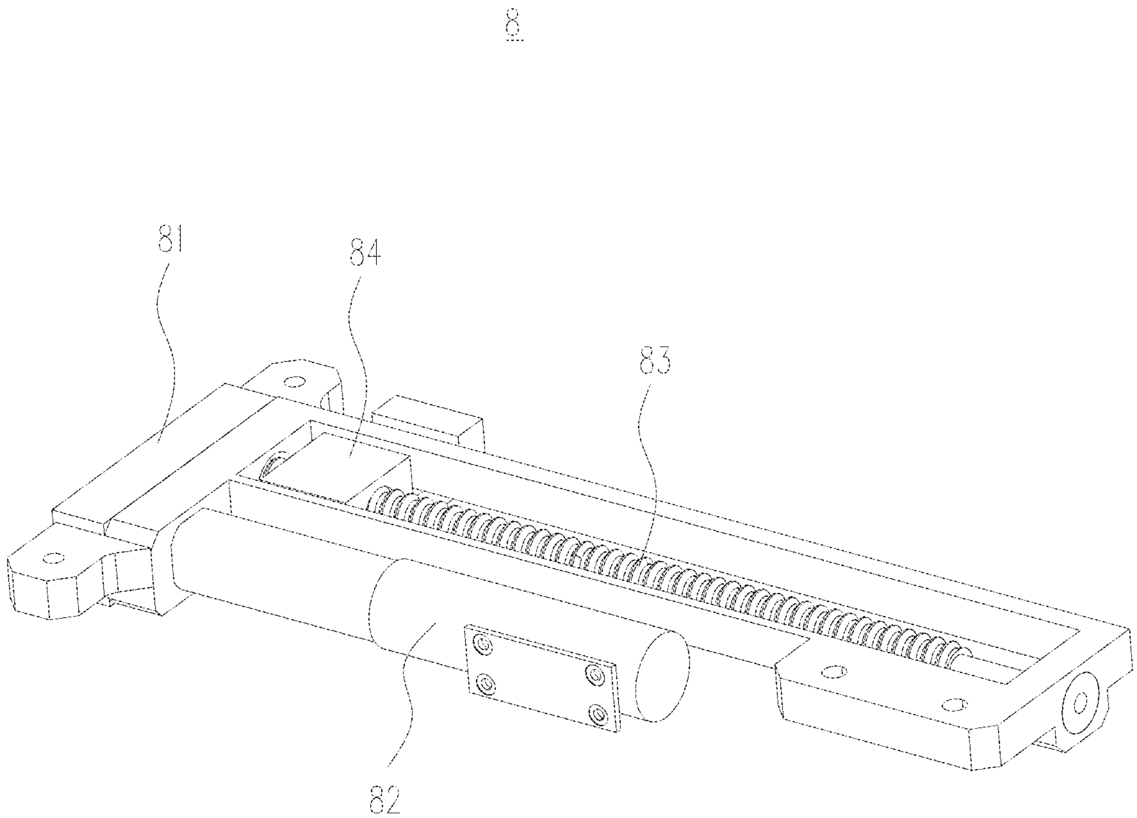
FIG. 16 shows a structural schematic view of a power supply structure of a flexible display device according to some embodiments of the present application.

In some embodiments, referring to FIG. 16, the power supply structure 8 includes a motor screw module. Exemplarily, the motor screw module includes a mounting seat 81, a driver 82, a transmission member 83 and a threaded block 84. The mounting seat 81 is fixed on the first screen end fixing member 3, and both the driver 82 and the transmission member 83 are arranged on the mounting seat 81. The driver 82 may be a servo motor or a stepper motor. The transmission member 83 may be a threaded rod and extend in the first direction X. Two ends of the transmission member 83 can be rotatably connected to the mounting seat 81 through a rolling bearing or a sliding bearing, and the driver 82 can drive the transmission member to rotate. The threaded block 84 is threadedly connected to the transmission member 83 and fixedly connected to the fixed portion 2. When the driver 82 drives the transmission member 83 to rotate, the threaded block 84 can move in the first direction X and drive the first screen end fixing member 3 to move relative to the fixed portion 2. Exemplarily, the fixed portion 2 includes a connecting arm 29, the threaded block 84 is fixedly connected to the connecting arm 29, and the first screen end fixing member 3 can move relative to the fixed portion 2 through the coordinating action between the threaded block 84 and the transmission member (screw) 83. It should be noted that during the unfolding process of the flexible display device, in order to ensure the unfolding of the flexible display device at a uniform speed, it is necessary to control the sum of a power force F3 provided by the power supply structure 8 and the first elastic force F1 to be equal to the second elastic force F2. In this case, the less the difference between the first elastic force F1 and the second elastic force F2 is, the less the power force F3 provided by the power supply structure 8 needs to be, so that it is easier to achieve the lightness and thinness of the power supply structure 8 and the flexible display device.

In some embodiments, the stress balancing structure 9 includes a damper. The damper can buffer the external force. When the flexible display device change the state under the human action, the damping generated by the damper can be transmitted to the fixed portion 2 and the first screen end fixing member 3, thereby buffering the instantaneous impact from the external force or other factors on the flexible display screen 1, preventing the flexible display device from stretching and retracting excessively quickly, and ensuring that the flexible display screen 1 can stretch and retract stably. In addition, when the state of the flexible display device remains unchanged, the damper can also provide a certain resistance force to prevent the flexible display device from stretching and retracting without any external force, thereby improving the using reliability of the flexible display device.

It should be noted that, compared to the power supply structure 8, the stress balancing structure 9 cannot achieve the automatic retracting or stretching of the flexible display device. Therefore, when using the stress balancing structure 9, it is necessary to manually pull the flexible display device to achieve the stretching and retracting of the flexible display device. In this process, the first elastic force F1 and the second elastic force F2 can serve as the stress balancing structure 9 to a certain extent, thereby ensuring that the flexible display device can stretch and retract stably at the uniform speed.

In some embodiments, the first elastic member 22 and the second elastic member 23 are constant force springs, that is, the magnitude of the first elastic force F1 or the magnitude of the second elastic force F2 does not change with the movement of their corresponding output ends.

In the related art, during the sliding process, the stretching force exerting on the flexible display screen 1 increases with the stretching amount increasing, so that the flexible display screen 1 is subjected to a relatively large force in the unfolded state, and prone to the display abnormality or other problems.

In the embodiments of the present application, since the first elastic member 22 and the second elastic member 23 are the constant force springs, the stresses on two ends of the flexible display screen 1 will not change with the state of the flexible display device being changed. Thus, the stress exerting on the flexible display screen 1 can be more stable in the unfolded state, so that the risk of the display abnormality can be reduced. Optionally, the magnitudes of both the first elastic force F1 and the second elastic force F2 are constant.

In some embodiments, a ratio of the first elastic force F1 to the second elastic force F2 is A, and A satisfies: 70%≤A≤130%.

The first elastic force F1 and the second elastic force F2 have the stretching functions on two ends of the flexible display screen 1, respectively. In order to ensure that the forces on the two ends of the flexible display screen 1 can maintain equilibrium as much as possible, in the embodiments of the present application, the ratio A of the first elastic force F1 to the second elastic force F2 can be set between 70% and 130%. Exemplarily, A is one of 70%, 85%, 100%, 110% or 130%.

It can be seen from the above content, during the unfolding-and-retracting process of the flexible display device, when the flexible display device is unfolded or retracted at the substantially uniformly speed, it is necessary to control the sum of the power force F3 provided by the power supply structure 8 and the first elastic force F1 to be slightly larger than or slightly less than the second elastic force F2. In this case, the less the difference between the first elastic force F1 and the second elastic force F2 is, the less the power force F3 provided by the power supply structure 8 needs to be, so that it is easier to achieve the miniaturization of the power supply structure 8 and thus achieve the lightness and thinness of the flexible display device.

Similarly, in the case that only the stress balancing structure (damper), rather than the power supply structure 8, is used, during the unfolding-and-retracting process of the flexible display device, when the flexible display device is unfolded or retracted at the substantially uniformly speed, the sum of an acting force provided by the user and the first elastic force F1 is slightly larger than or slightly less than the second elastic force F2. In this case, the less the difference between the first elastic force F1 and the second elastic force F2 is, the less the acting force provided by the user needs to be, so that the operation can be easier. In addition, in a static state after unfolding, retracting or partial unfolding, the less the equilibrium force provided by the stress balancing structure (damper) need to be, the easier it is to achieve the miniaturization of the stress balancing structure (damper), and thus achieve the lightness and thinness of the flexible display device.

Optionally, the magnitudes of the first elastic force F1 is equal to the magnitudes of the second elastic force F2, so that the size of the power supply structure 8 and/or the stress balancing structure (damper) can be reduced, and the lightness and thinness of the flexible display device can be achieved better.

In the embodiments of the present application, be limiting the ratio A of the first elastic force F1 to the second elastic force F2, the stresses on two ends of the flexible display screen 1 can be relatively stable and consistent. Therefore, during the stretching-and-retracting process of the flexible display device, the stretching-and-retracting smoothness of the flexible display device can also be improved.

In some embodiments, as shown in FIG. 4, there are two first elastic members 22, which are arranged side by side.

It can be seen from the mentioned above, the output end of the first elastic member 22 is connected to the first screen end fixing member 3, and the first elastic member 22 provides the first elastic force F1 to the flexible display screen 1 through the first screen end fixing member 3. The first elastic force F1 can reduce the magnitude of stress needed for the transition of flexible display device from the folded state to the unfolded state. Further, to a certain extent, the number or the size of power supply structure 8 or the stress balancing structure 9 can be reduced, so that more other parts can be arranged inside the flexible display device, and the overall size of the flexible display device can be reduced.

In addition, in some embodiments, there are two second elastic members 23, which are arranged side by side. The two first elastic members 22 and the two second elastic members 23 are correspondingly arranged, respectively, and the two first elastic members 22 and the two second elastic members 23 can simultaneously stretch the two ends of flexible display screen 1, thereby reducing the problem of the display abnormality of flexible display screen 1. Optionally, the two second elastic members 23 are located between the two first elastic members 22.

In some embodiments, the two first elastic members 22 or the two second elastic members 23 are symmetrically arranged relative to a central position of the flexible display device.

The "central position" referred to in the embodiments of the present application specifically refers to the structure at a middle position in the second direction of the flexible display device. According to this design, the stretching force generated by the first elastic members 22 or the second elastic members 23 onto the flexible display screen 1 can be more balanced, which can effectively avoid the display abnormality caused by uneven forces on various parts of the flexible display screen 1.

Although the present application has been described with reference to the embodiments, various modifications may be made and equivalents may be substituted for parts of the embodiments without departing from the scope of the present application. In particular, as long as there is no structural conflict, the technical features mentioned in the embodiments can be combined in any manner. The present application is not limited to the specific embodiments disclosed herein, but includes all technical solutions falling within the scope of the claims.

What is claimed is:

1. A flexible display device comprising:

a fixed portion;

a shaft, arranged on the fixed portion;

a first screen end fixing member, slidably mounted on the fixed portion, and a sliding direction being perpendicular to an axial direction of the shaft;

a second screen end fixing member, slidably mounted on the fixed portion, and a sliding direction being perpendicular to the axial direction of the shaft;

a flexible display screen, wound on the shaft, one end of the flexible display screen being fixed to the first screen end fixing member, and the other end of the flexible display screen being fixed to the second screen end fixing member;

at least one first elastic member, mounted between the fixed portion and the first screen end fixing member, and providing a first elastic force to the first screen end fixing member; and at least one second elastic member, mounted between the fixed portion and the second screen end fixing member, and providing a second elastic force to the second screen end fixing member;

wherein the first elastic force at least partially maintains equilibrium with the second elastic force; and at least one of a power supply structure or a stress balancing structure arranged between the first screen end fixing member and the fixed portion, the power supply structure and the stress balancing structure are arranged between the first screen end fixing member and the fixed portion, or between the second screen end fixing member and the fixed portion, or between the fixed portion and the shaft, the power supply structure is configured to provide a driving force to the fixed portion to move relative to the first screen end fixing member and an anchoring force when the fixed portion is fixed relative to the first screen end fixing member, and the stress balancing structure is configured to provide the anchoring force when the fixed portion is fixed relative to the first screen end fixing member.

2. The flexible display device according to claim 1, wherein a first guiding-and-sliding mechanism is arranged between the fixed portion and the first screen end fixing member, and a second guiding-and-sliding mechanism is arranged between the fixed portion and the second screen end fixing member.

3. The flexible display device according to claim 2, wherein the first guiding-and-sliding mechanism comprises a first guiding-and-sliding block arranged on the fixed portion and a first sliding groove arranged on the first screen end fixing member and extending in a first direction, and the first guiding-and-sliding block is slidably disposed on the first sliding groove.

4. The flexible display device according to claim 3, wherein the second guiding-and-sliding mechanism comprises a second sliding groove arranged on the fixed portion and extending in the first direction and a second guiding-and-sliding block arranged on the second screen end fixing member, and the second guiding-and-sliding block is slidably disposed on the second sliding groove.

5. The flexible display device according to claim 4, wherein the fixed portion comprises a guiding-and-sliding mounting part, and both the first guiding-and-sliding block and the second sliding groove are arranged on the guiding-and-sliding mounting part.

6. The flexible display device according to claim 4, wherein the fixed portion further comprises a support beam extending in a second direction, the first direction intersects with the second direction, and the guiding-and-sliding mounting part is connected to the support beam.

7. The flexible display device according to claim 6, wherein the shaft and the guiding-and-sliding mounting part are located on two sides of the support beam in the first direction, respectively, the fixed portion further comprises an elastic member mounting part connected to the guiding-and-sliding mounting part, at least one of the first elastic member or the second elastic member is mounted on the elastic member mounting part, an output end of the first elastic member is connected to the first screen end fixing member, and an output end of the second elastic member is connected to the second screen end fixing member.

8. The flexible display device according to claim 7, wherein the first screen end fixing member comprises a first body and a first connecting part arranged on a side of the first body facing the second screen end fixing member, and the output end of the first elastic member is connected to the first connecting part.

9. The flexible display device according to claim 8, wherein the second screen end fixing member comprises a second body and a second connecting part arranged on a side of the second body facing the first screen end fixing member, and the output end of the second elastic member is connected to the second connecting part.

10. The flexible display device according to claim 9, further comprising a stretching part support member fixed to the fixed portion;

wherein the stretching part support member is arranged on the side of the first body facing the second screen end fixing member and provided with an avoidance groove, and the first connecting part is configured to be slidable in the avoidance groove.

11. The flexible display device according to claim 10, comprising a folded state and an unfolded state, wherein in the folded state, the stretching part support member is at least partially overlapped with the first screen end fixing member in a thickness direction of the flexible display device.

12. The flexible display device according to claim 10, further comprising a bending support member, wherein the bending support member comprises a first end and a second end opposite to each other in an extending direction thereof, the first end is fixed to the first screen end fixing member, and the second end is fixed to the second screen end fixing member.

13. The flexible display device according to claim 12, wherein at least a portion of structure in the bending support member is in contact with the stretching part support member.

14. The flexible display device according to claim 12, wherein an end of the flexible display screen is fixed to an end of the first body away from the shaft, or an end of the flexible display screen is fixed to an end of the second body away from the shaft.

15. The flexible display device according to claim 12, wherein the bending support member comprises a flexible support part and a rigid support part;

the flexible support part comprises a third region, and a first region and second region located on two sides of the third region in an extending direction of the bending support member, respectively, the rigid support part is arranged in the third region, the first end is arranged in the first region, and the second end is arranged in the second region.

16. The flexible display device according to claim 15, wherein a first concaved portion is arranged at an end of the first screen end fixing member near the bending support member, the flexible support part is arranged on the first concaved portion, and a thickness of the flexible support part is equal to a depth of the first concaved portion.

17. The flexible display device according to claim 1, wherein the power supply structure comprises a motor screw module, and the stress balancing structure comprises a damper.

18. The flexible display device according to claim 1, wherein both the first elastic member and the second elastic member are provided as constant force springs, a ratio of the first elastic force to the second elastic force is A, and A satisfies: $70\% \le A \le 130\%$.

19. The flexible display device according to claim 1, comprising two first elastic members arranged side by side, and two second elastic members arranged side by side, wherein the two second elastic members are located between the two first elastic members, and the two first elastic members or two second elastic members are symmetrically arranged relative to a central position of the flexible display device.

* * * * *